(12) United States Patent
Shinohara

(10) Patent No.: US 10,879,886 B1
(45) Date of Patent: Dec. 29, 2020

(54) SWITCH CIRCUIT SUPPRESSING DAMAGE TO THE SWITCH CIRCUIT

(71) Applicants: Kabushiki Kaisha Toshiba, Tokyo (JP); Toshiba Electronic Devices & Storage Corporation, Tokyo (JP)

(72) Inventor: Masatoshi Shinohara, Tokyo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/788,794

(22) Filed: Feb. 12, 2020

(30) Foreign Application Priority Data

Sep. 2, 2019 (JP) ................................ 2019-159630

(51) Int. Cl.

| | |
|---|---|
| *H03K 17/082* | (2006.01) |
| *H03K 17/06* | (2006.01) |
| *H02M 3/07* | (2006.01) |
| *H03K 17/687* | (2006.01) |
| *H03K 17/60* | (2006.01) |
| *H03K 17/16* | (2006.01) |
| *H03K 17/081* | (2006.01) |
| *H03K 17/0814* | (2006.01) |

(52) U.S. Cl.
CPC .......... *H03K 17/063* (2013.01); *H02M 3/073* (2013.01); *H03K 17/081* (2013.01); *H03K 17/0814* (2013.01); *H03K 17/0822* (2013.01); *H03K 17/0826* (2013.01); *H03K 17/161* (2013.01); *H03K 17/60* (2013.01); *H03K 17/687* (2013.01)

(58) Field of Classification Search
CPC .. H03K 17/063; H03K 17/60; H03K 17/0826; H03K 17/687; H03K 17/0822; H03K 17/161; H03K 17/08104; H03K 17/081; H03K 17/08112; H03K 17/08116; H03K 17/0812; H03K 17/08122; H03K 17/08124; H03K 17/08126; H03K 17/08128; H02M 3/073
See application file for complete search history.

(56) References Cited

U.S. PATENT DOCUMENTS

| | | | |
|---|---|---|---|
| 5,017,816 A | 5/1991 | Wilcox | |
| 5,352,932 A | 10/1994 | Tihanyi | |
| 5,905,400 A | 5/1999 | Runkel | |

(Continued)

FOREIGN PATENT DOCUMENTS

| | | |
|---|---|---|
| JP | H03-013119 A | 1/1991 |
| JP | H03-172017 A | 7/1991 |

(Continued)

*Primary Examiner* — Jung Kim
(74) *Attorney, Agent, or Firm* — White & Case LLP

(57) ABSTRACT

In general, according to one embodiment, a switch circuit includes first to fourth transistors and first to second resistors. The third transistor includes one terminal coupled to one terminal of the first transistor and another terminal coupled to a control terminal of the first transistor. The fourth transistor includes one terminal coupled to a control terminal of the third transistor, another terminal coupled to another terminal of the first transistor, and a control terminal coupled to the control terminal of the first transistor. The second resistor is coupled between the one terminal of the third transistor and the control terminal of the third transistor.

12 Claims, 5 Drawing Sheets

(56) References Cited

U.S. PATENT DOCUMENTS

| | | |
|---|---|---|
| 6,972,973 B2 | 12/2005 | Abe et al. |
| 10,082,813 B1 * | 9/2018 | Shinohara ............... G05F 1/613 |
| 10,103,539 B2 | 10/2018 | Iwamizu et al. |

FOREIGN PATENT DOCUMENTS

| | | |
|---|---|---|
| JP | 3249239 B2 | 1/2002 |
| JP | 2004-222394 A | 8/2004 |
| JP | 3718040 B2 | 11/2005 |
| JP | 2016-116151 A | 6/2016 |

* cited by examiner

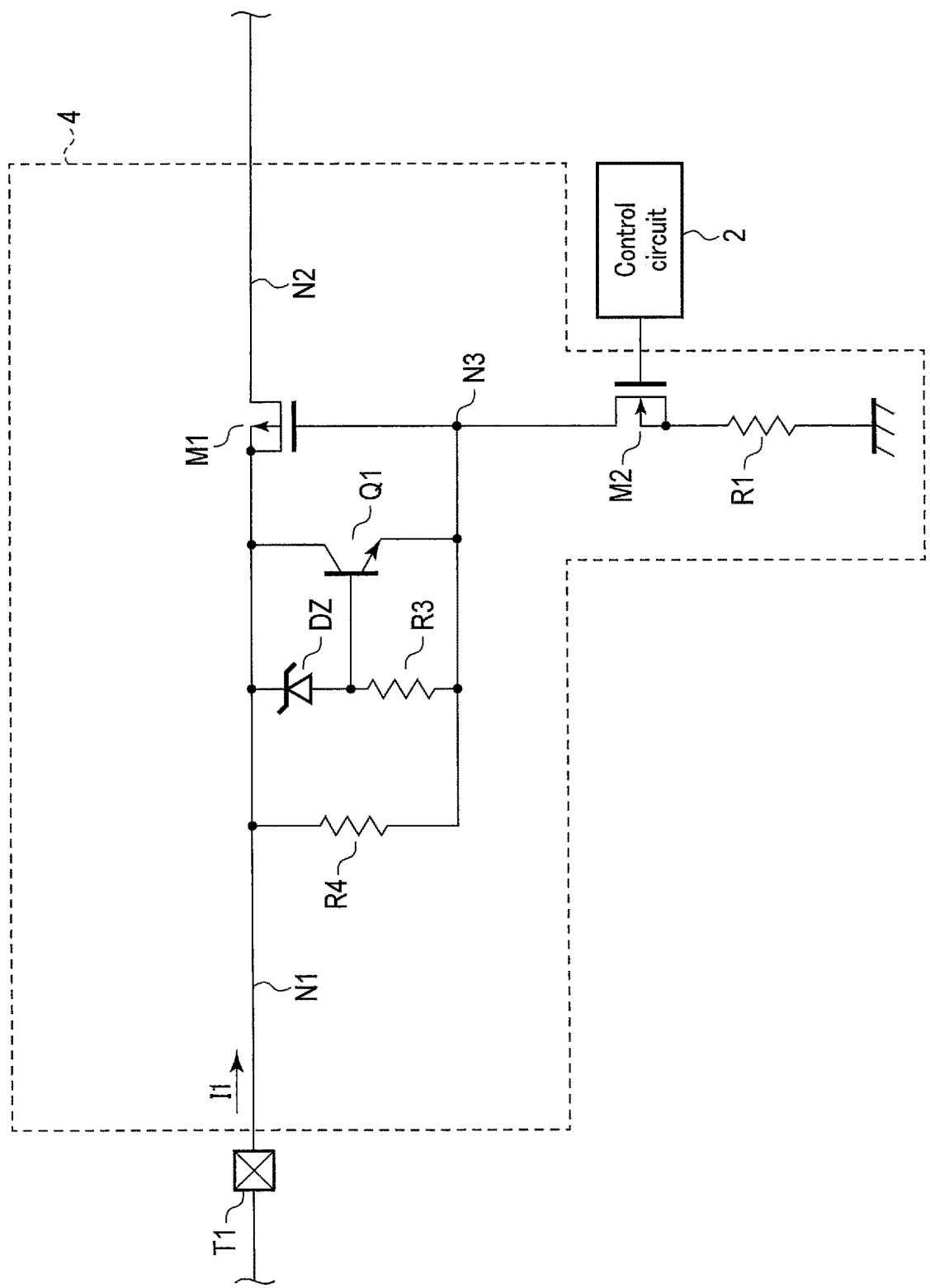
F I G. 3

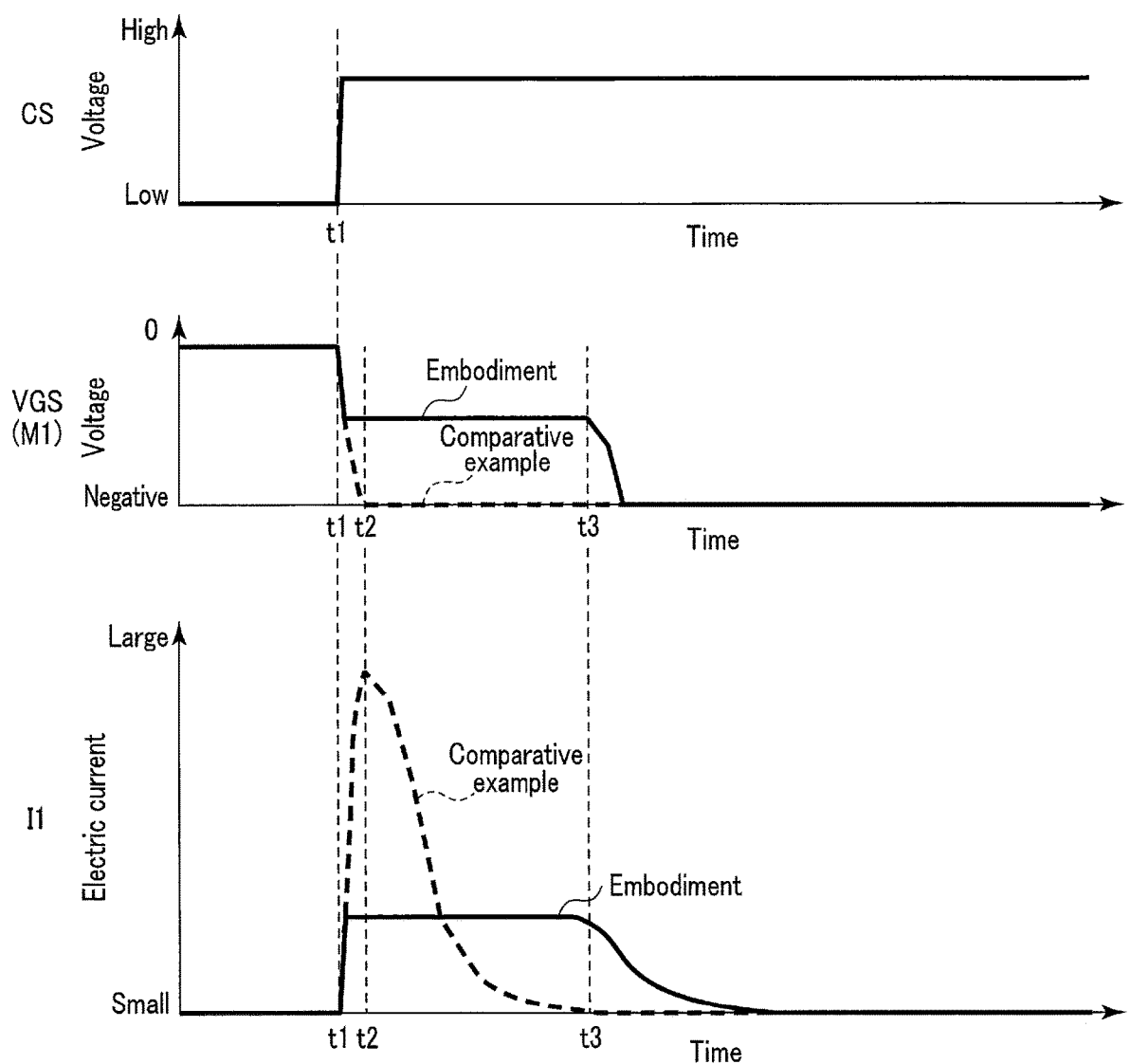
F I G. 4

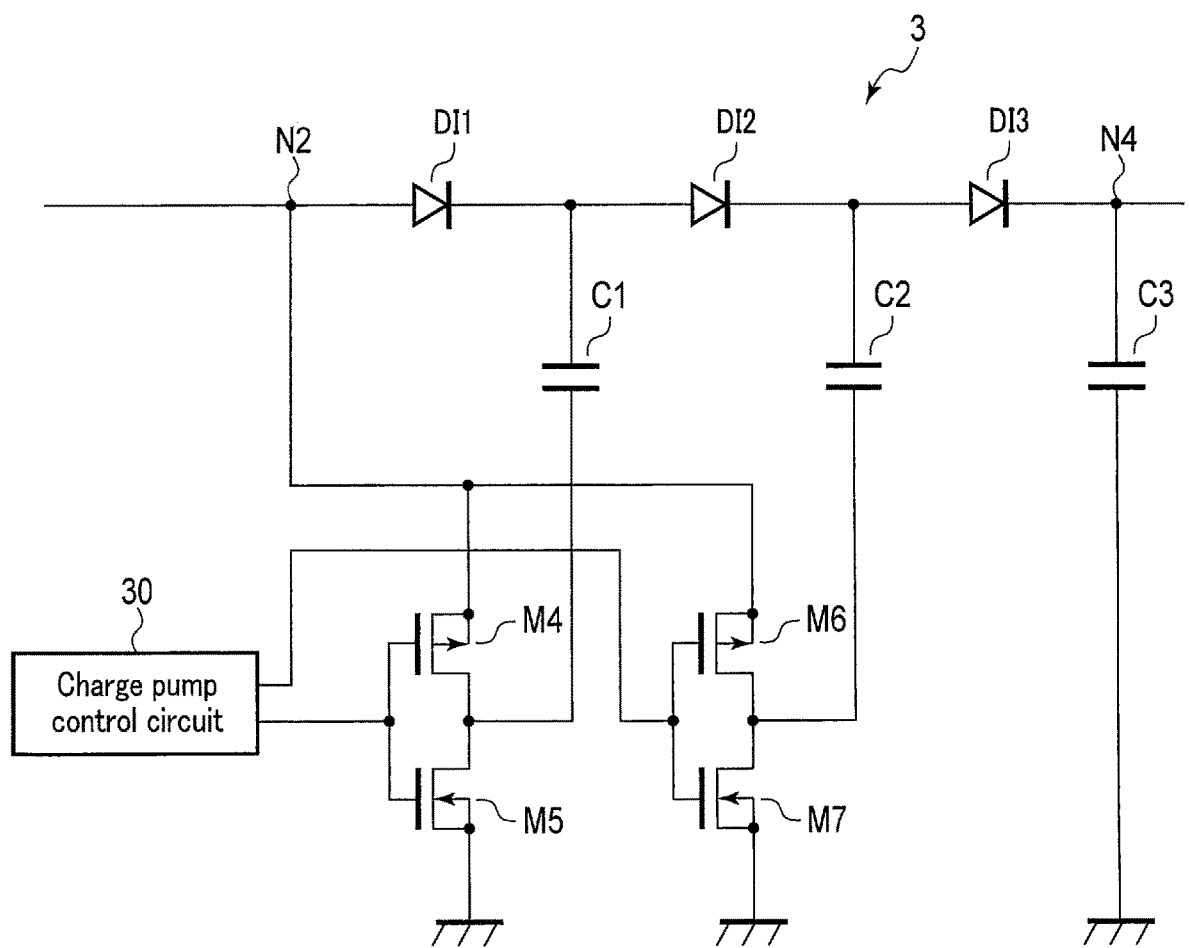
F I G. 5

SWITCH CIRCUIT SUPPRESSING DAMAGE TO THE SWITCH CIRCUIT

CROSS-REFERENCE TO RELATED APPLICATIONS

This application is based upon and claims the benefit of priority from Japanese Patent Application No. 2019-159630, filed Sep. 2, 2019, the entire contents of which are incorporated herein by reference.

FIELD

Embodiments described herein relate generally to a switch circuit.

BACKGROUND

A switch circuit used for supplying power to a circuit is known.

BRIEF DESCRIPTION OF THE DRAWINGS

FIG. 3 is a circuit diagram illustrating a comparative example of the switch circuit according to the embodiment.

FIG. 4 illustrates graphs showing changes in voltage and electric current with time in switch circuits according to the embodiment and its comparative example.

FIG. 5 is a circuit diagram illustrating an example function circuit included in the system including the switch circuit according to the embodiment.

DETAILED DESCRIPTION

Figure 1:
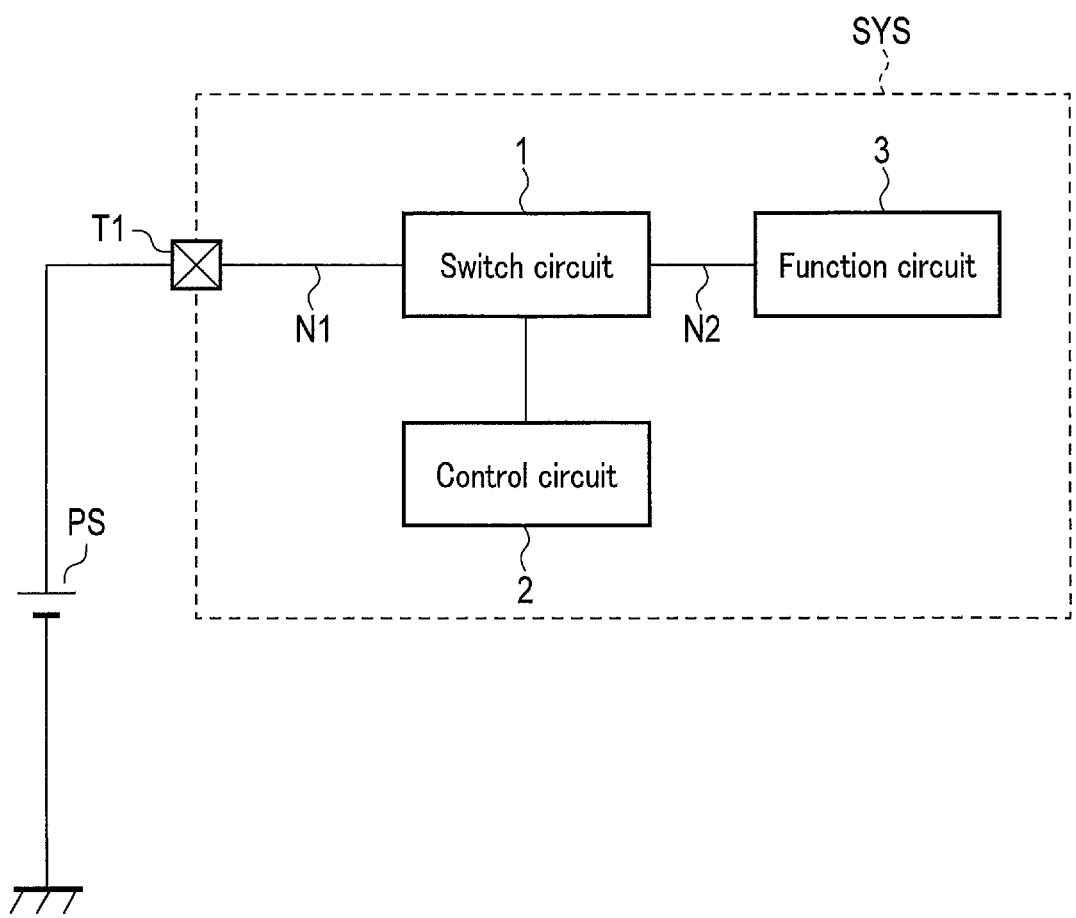
FIG. 1 is a block diagram illustrating an example configuration of a system including a switch circuit according to an embodiment.

In general, according to one embodiment, a switch circuit includes a first transistor, a second transistor, a first resistor, a third transistor, a fourth transistor, a second resistor. The second transistor includes one terminal grounded and another terminal coupled to a control terminal of the first transistor. The first resistor is coupled between one terminal of the first transistor and the control terminal of the first transistor. The third transistor includes one terminal coupled to the one terminal of the first transistor and another terminal coupled to the control terminal of the first transistor. The fourth transistor includes one terminal coupled to a control terminal of the third transistor, another terminal coupled to another terminal of the first transistor, and a control terminal coupled to the control terminal of the first transistor. The second resistor is coupled between the one terminal of the third transistor and the control terminal of the third transistor.

Hereinafter, embodiments will be described with reference to the accompanying drawings. Each of the embodiments is an example of an apparatus and a method to embody a technical idea of the invention. The drawings are schematic or conceptual, and the dimensions and ratios, etc. in the drawings are not always the same as the actual ones. The technical ideas of the present invention are not limited by shapes, structures, or arrangements, etc. of the components.

In the description that follows, components having substantially the same functions and configurations will be denoted by the same reference symbols. The numbers after the letters constituting the reference symbols are used to discriminate between components that are denoted by the reference symbols sharing letters in common and that have similar configurations. If there is no need to discriminate between components that are denoted by the reference symbols sharing letters in common, such components are denoted by reference symbols that include the letters only.

Embodiment

A switch circuit 1 according to an embodiment will be described below.

[1] Configuration of Switch Circuit 1

[1-1] Overall Configuration of System SYS Including Switch Circuit 1

FIG. 1 illustrates an example configuration of a system SYS including the switch circuit 1 according to the embodiment. As illustrated in FIG. 1, the system SYS includes a terminal T1, the switch circuit 1, a control circuit 2, and a function circuit 3. The system SYS may be integrated on, for example, one semiconductor chip. Alternatively, the system SYS may be constructed on a printed circuit board by, for example, combining a plurality of semiconductor chips using a plurality of connecting elements.

In the system SYS, the terminal T1 is configured to be coupled to external equipment. The terminal T1 is a power terminal of the system SYS and is coupled to the switch circuit 1. The terminal T1 is coupled to, for example, a power supply PS. The power supply PS is provided outside the system SYS and supplies a power supply voltage VDD to the system SYS.

The switch circuit 1 is coupled between the terminal T1 and the function circuit 3. The switch circuit 1 electrically couples or decouples the terminal T1 to or from the function circuit 3. Hereinafter, an ON state refers to a state in which the switch circuit 1 electrically couples the terminal T1 to the function circuit 3, and an OFF state refers to a state in which the switch circuit 1 electrically decouples the terminal T1 from the function circuit 3. A node between the terminal T1 and the switch circuit 1 is referred to as node N1, and a node between the switch circuit 1 and the function circuit 3 is referred to as node N2.

The control circuit 2 controls the switch circuit 1 to the ON state or OFF state. The function circuit 3 is circuitry that executes various operations, which may include various circuits. For example, the function circuit 3 executes operations of generating a high voltage, generating a control signal, and the like. The function circuit 3 is supplied with the power supply voltage VDD through the switch circuit 1.

[1-2] Configuration of Switch Circuit 1

Figure 2:
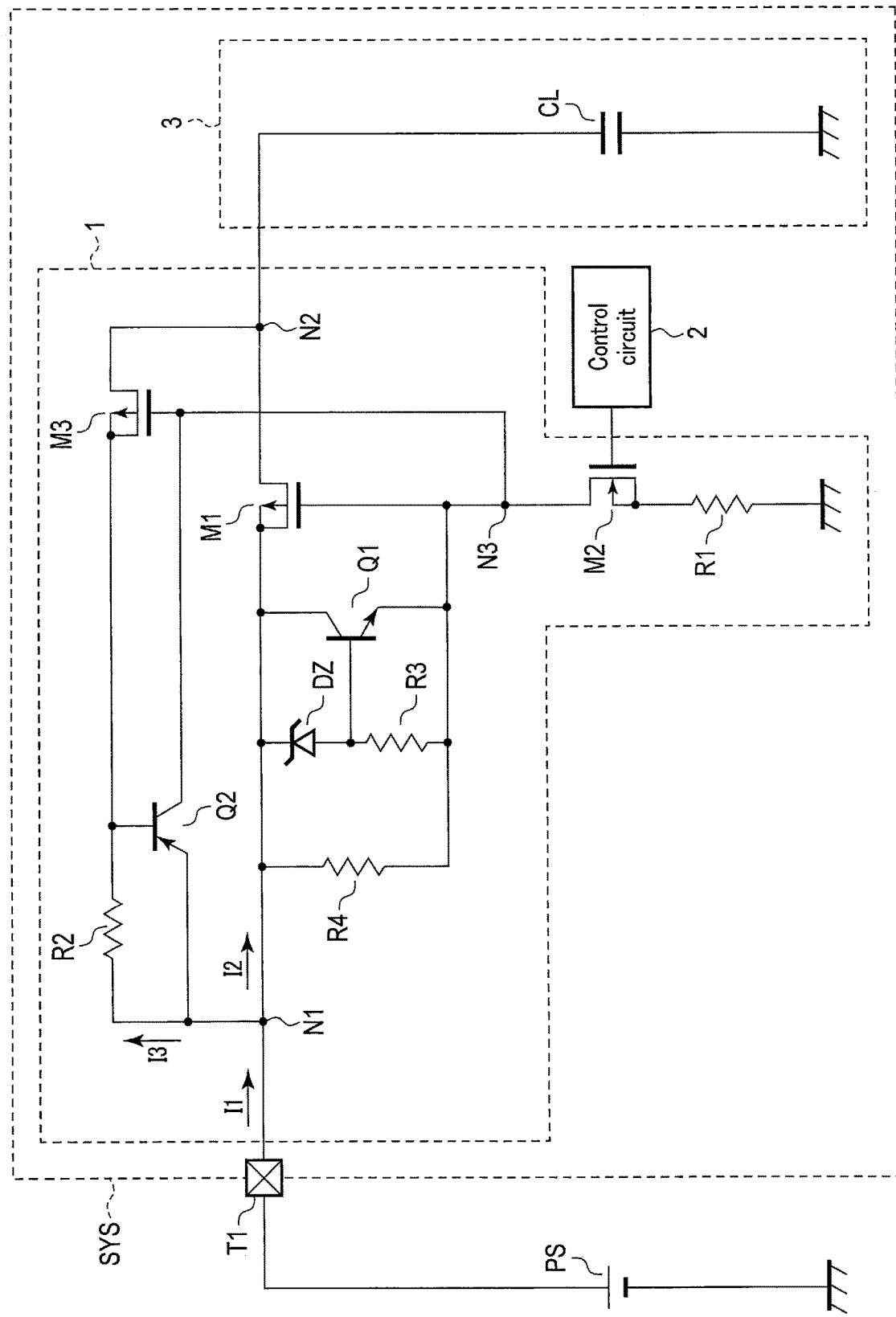
FIG. 2 is a circuit diagram illustrating an example configuration of the switch circuit according to the embodiment.

FIG. 2 is a circuit diagram for illustrating details of the switch circuit 1 according to the embodiment. As shown in FIG. 2, the switch circuit 1 includes transistors M1 to M3, transistors Q1 and Q2, a zener diode DZ, and resistors R1 to R4. The function circuit 3 includes a capacitive load CL.

Transistors M1 and M3 are, for example, a p-type MOSFET. Transistor M2 is, for example, an n-type MOSFET. Transistor Q1 is, for example, an NPN bipolar transistor. Transistor Q2 is, for example, a PNP bipolar transistor.

A source of the transistor M1 is coupled to a node N1. A drain of the transistor M1 is coupled to a node N2. A gate of the transistor M1 is coupled to a node N3. A drain of the transistor M2 is coupled to the node N3. A gate of the transistor M2 is coupled to the control circuit 2. A source of the transistor M2 is coupled to one terminal of the resistor R1. The other terminal of the resistor R1 is grounded.

A collector of the transistor Q1 is coupled to the node N1. An emitter of the transistor Q1 is coupled to the node N3. A base of the transistor Q1 is coupled to each of an anode of the zener diode DZ and one terminal of the resistor R3. A cathode of the zener diode DZ is coupled to the node N1. The other terminal of the resistor R3 is coupled to the node N3. One terminal of the resistor R4 is coupled to the node N1. The other terminal of the resistor R4 is coupled to the node N3.

One terminal of the resistor R2 is coupled to the node N1. The other terminal of the transistor R2 is coupled to each of a base of the transistor Q2 and a source of the transistor M3. An emitter of the transistor Q2 is coupled to the node N1. A collector of the transistor Q2 is coupled to the node N3. A drain of the transistor M3 is coupled to the node N2. A gate of the transistor M3 is coupled to the node N3.

The transistor M1 has a size that provides the transistor M1 with a small ON resistance. An ON resistance RON(M1) of the transistor M1 is, for example, 1Ω. The transistor M3 is smaller than the transistor M1 in size. The transistor M3 is, for example, 1/1000 the size of the transistor M1. An ON resistance RON(M3) of the transistor M3 is, for example, 1Ω.

A threshold voltage Vth(M1) of the transistor M1 is substantially equal to a threshold voltage Vth(M3) of the transistor M3. The threshold voltages of transistors M1 and M3 are greater than a threshold voltage Vth(Q2) of the transistor Q2 in magnitude. The threshold voltage Vth(Q2) of the transistor Q2 is, for example, 0.7 V. A resistance of the resistor R2 is, for example, 1 kΩ.

The control circuit 2 applies a control signal CS to the gate of the transistor M2. The control signal CS is, for example, a digital signal having two states of an "H" level and an "L" level. For example, when a voltage at the "L" level is applied to the gate of transistor M2, transistor M2 is in the OFF state. When a voltage at the "H" level is applied to the gate of transistor M2, transistor M2 is in the ON state.

The capacitive load CL representatively indicates various capacitive loads that are included in the function circuit 3. The capacitive load CL has one electrode coupled to the node N2 and the other electrode grounded. For the sake of simplifying the description of embodiments, descriptions are omitted of elements included in the function circuit 3 other than the capacitive load.

[2] Operation of Switch Circuit 1

The operation of the switch circuit 1 according to the embodiment will be described still with reference to FIG. 2. As shown in FIG. 2, the terminal T1 is coupled to the power supply PS. The power supply PS applies the power supply voltage VDD to the terminal T1. An electric current passing from the power supply PS to the node N1 is defined as I1, an electric current passing from the node N1 to the node N2 through the transistor M1 is defined as I2, and an electric current passing from the node N1 to the node N2 through the resistor R2 and the transistor M3 is defined as I3. Described below in order are how the switch circuit 1 is controlled from the OFF state to the ON state and how the capacitive load CL is charged.

The expression "complete charging a capacitive load CL" used herein refers to a state in which a voltage of the node N1 is substantially equal to a voltage of the node N2. For example, when the voltage of the node N2 is slightly lower than but substantially equal to that of the node N1, it is expressed as "charging is completed".

(When Switch Circuit 1 Is in OFF State)

First, the operation of the system SYS when the switch circuit 1 is controlled to the OFF state will be described. The control circuit 2 outputs the control signal CS at the "L" level to control the switch circuit 1 to the OFF state. To be more specific, the control circuit 2 controls the transistor M2 to the OFF state. Since the transistor M2 is in the OFF state, a voltage of the node N3 is equal to that of the node N1, to which the node N3 is coupled via the resistor R4. Since the voltage of the node N1 is equal to that of the node N3, the transistors M1 and M3 as well as the transistors Q1 and Q2 are in the OFF state. Further, a gate-source voltage VGS (M1) of the transistor M1 is approximately 0 V. Since the transistors M1 and M3 are in the OFF state, the node N1 and the node N2 are electrically decoupled from each other. Further, each of the electric currents I1, I2, and I3 is approximately 0 A. Thus, the capacitive load CL is supplied with no voltage and is not charged.

(When Switch Circuit 1 Enters ON State, and Electric Current Starts Passing)

Next, the operation of the system SYS when the switch circuit 1 is controlled to the ON state, in which an electric current starts passing from the node N1 to the node N2 will be described. The control circuit 2 outputs the control signal CS at the "H" level to control the switch circuit 1 to the ON state. To be more specific, the control circuit 2 controls the transistor M2 to the ON state. Since the transistor M2 has entered the ON state, an electric current passes from the node N1 to the ground node through the resistor R4, the transistor M2, and the resistor R1. Since the electric current passes through the resistor R4, a voltage difference occurs between both terminals of the resistor R4, namely, between the node. N1 and the node N3. When the voltage difference between node N1 and node N3 is greater than each of the threshold voltages of transistors M1 and M3, the transistors M1 and M3 each enter the ON state. In response to the transistors M1 and M3 entering the ON state, electric currents I2 and I3 start passing. Electric currents I2 and I3 flow into the capacitive load CL. Since the capacitive load CL is not charged, electric currents I2 and I3 increase so as to charge the capacitive load CL.

The magnitude ratio of the electric current I2 to the electric current I3 is approximately equal to the size ratio of the transistor M1 to the transistor M3. For example, when the size of the transistor M3 is approximately 1/1000 the size of the transistor M1, a magnitude of the electric current I3 is approximately 1/1000 a magnitude of the electric current I2. That is, the electric current I2 is a main electric current that passes through the switch circuit 1 toward the function circuit 3.

The switch circuit 1 has current paths of the electric currents I2 and I3 from the node N1 to the node N3. In addition, the switch circuit 1 has current paths leading from the node N1 to the ground node. However, the magnitude of the electric current passing through such a current path is sufficiently smaller than that of the electric current I2. Thus, for the sake of simplifying an explanation, the electric current I1 or I2 can be regarded as a total electric current passing through the switch circuit 1 toward the function circuit 3.

(When Electric Current Is Limited by Switch Circuit 1)

Subsequently, the operation of the system SYS when the switch circuit 1 is in the ON state and limits the electric current will be described. When the transistors M1 and M3 are in the ON state, the electric currents I2 and I3 increase so as to charge the capacitive load CL. When a voltage difference between both terminals of the resistor R2 caused by the electric current I3 passing through the resistor R2 is equal to or greater than the threshold voltage Vth(Q2) of the transistor Q2, the transistor Q2 enters the ON state. The transistor Q2 in the ON state imposes a limit on the voltage difference between the node N1 and the node N3, thus limiting the gate-source voltage VGS(M1) of the transistor M1 and a gate-source voltage VGS(M3) of the transistor M3.

Where the size of the transistor M1 is S times the size of the transistor M3 (S is a positive real number), the magnitude of a threshold voltage of the transistor Q2 is Vth(Q2), and the resistance of resistor R2 is R2, the magnitude I2(lim1) of the limited electric current I2 is expressed by "I2(lim1)=(Vth (Q2)/R2)×S".

In the system SYS, charging of the capacitive load CL is continued with the magnitude of the electric current I2 limited to I2(lim1).

(When Charging of Capacitive Load Has Been Completed)

Next, the operation of the system SYS in a state in which charging of the capacitive load CL has been completed will be described. Since charging of the capacitive load CL has been completed, the electric currents I2 and I3 decrease in magnitude, and the voltage difference between both terminals of the resistor R2 falls below the threshold voltage Vth(Q2) of the transistor Q2, bringing the transistor Q2 into the OFF state. The transistor Q2 entering the OFF state makes the voltage difference between the node N1 and the node N3 greater than the voltage difference as limited by transistor Q2. As the voltage difference between both terminals of the resistor R4 increases, the voltage difference between the node N1 and the node N3 increases. When the difference between the voltage of the node N1 and that of the node N3 is equal to or greater than a zener voltage Vz(DZ) of the zener diode, an electric current passes through the zener diode DZ, and the voltage difference between both terminals of the zener diode DZ is kept at the zener voltage Vz(DZ). The electric current passing from the node N1 through the zener diode DZ passes through the resistor R3 toward the node N3. When a voltage difference between both terminals of the resistor R3 is equal to or greater than a threshold voltage Vth(Q1) of the transistor Q1, the transistor Q1 enters the ON state. Since the transistor Q1 has entered the ON state, the voltage difference between the node N1 and the node N3 becomes a sum of the zener voltage Vz(DZ) of the zener diode DZ and the threshold voltage Vth(Q1) of the transistor Q1. In the way described above, the voltage difference between the node N1 and the node N3 is determined.

With the voltage of the node N2 substantially equal to that of the node N1, each of the transistors M1 and M3 operates in the non-saturation region. A electric current amount I2 (lim2) that the switch circuit 1 can supply in this state can be expressed by "I2(lim2)=((R2+RON(M3))/(R2×RON (M1)×Vth(Q2))". When electric current I2 increases with the voltage of the node N2 substantially equal to that of the node N1, the gate-source voltage VGS(M1) of the transistor M1 is limited, thus limiting the magnitude of the electric current I2 to I2(lim2).

[3] Advantageous Effects of Embodiment

The above-described embodiment can suppress damage to the switch circuit 1 and can improve the operation reliability thereof. Advantageous effects of the switch circuit 1 according to the embodiment will be described in detail below.

A switch circuit is used to reduce a standby power of a system. A current consumption can be reduced by providing the switch circuit between a power supply and a function circuit and electrically decoupling the power supply from the function circuit when the function circuit need not operate.

However, when the switch circuit is turned on, a charging electric current passes through the switch circuit so as to charge the capacitive load included in the function circuit. A magnitude of the charging electric current can increase depending on the amount of the capacitive load to be charged. A large electric current passing through the switch circuit may damage an element or interconnect constituting the switch circuit.

FIG. 3 illustrates an example configuration of a switch circuit 4 according to a comparative example of the embodiment. As shown in FIG. 3, the switch circuit 4 according to the comparative example has a configuration in which the transistor M3, the transistor Q2, and the resistor R2 are omitted from the switch circuit 1 according to the embodiment.

In the switch circuit 4 according to the comparative example, when the transistor M2 is turned on, the gate-source voltage VGS(M1) of the transistor M1 becomes the sum of the zener voltage Vz(DZ) of the zener diode DZ and the threshold voltage Vth(Q1) of the transistor Q1.

FIG. 4 shows example changes in the voltage and the electric current with time in the switch circuit 1 according to the embodiment and the switch circuit 4 according to the comparative example. In the example shown in FIG. 4, the switch circuit 1 according to the embodiment and the switch circuit 4 according to the comparative example operate in a state where the switch circuits are supplied with power-supply voltages VDD of the same magnitude and are coupled to the capacitive loads CL of the same amount. FIG. 4 illustrates three graphs arranged vertically. The graphs show, in descending order, a relationship between the control signal CS and time, a relationship between the gate-source voltage VGS(M1) of the transistor M1 and time, and a relationship between the electric current I1 and time. Further, in the graphs of the voltage VGS(M1) and of the electric current I1, a solid line indicates a case of the embodiment, and a broken line indicates a case of the comparative example.

As shown in FIG. 4, at a time t1, the control signal CS which the control circuit 2 applies to the gate of the transistor M2 transitions from the "L" level to the "H" level. The control signal CS upon transitioning to the "H" level brings the transistor M2 into the ON state, increasing a magnitude of the gate-source voltage VGS (M1) of the transistor M1.

In the switch circuit 4 according to the comparative example, from the time t1 to a time t2, the gate-source voltage VGS(M1) increases up to the sum of the zener voltage Vz(DZ) of the zener diode DZ and the threshold voltage Vth (Q1) of the transistor Q1. As the gate-source voltage VGS(M1) increases, the electric current I1 passing through the switch circuit 1 increases so as to charge the capacitive load CL. After the time t2, the electric current I1 decreases as charging of the capacitive load CL progresses.

In contrast, in the switch circuit 1 according to the embodiment, from the time t1 to a time t3, the magnitude of the gate-source voltage VGS(M1) of the transistor M1 is limited to be smaller than in the comparative example. In other words, the magnitude of the gate-source voltage VGS (M1) of the transistor M1 is fixed at a smaller value than in the comparative example. Consequently, in the switch circuit 1 according to the embodiment, a maximum value of the electric current I1 passing through the switch circuit 1 is limited to be smaller than a maximum value of the electric current I1 passing through the switch circuit 4 of the comparative example. As charging of the capacitive load CL progresses with the limited electric current I1, the electric current I1 decreases after the time t3, and the magnitude of the gate-source voltage VGS(M1) increases up to the sum of the zener voltage Vz(DZ) of the zener diode DZ and the threshold voltage Vth(Q1) of the transistor Q1 as in the comparative example. In the way described above, the switch circuit 1 according to the embodiment limits the gate-source voltage VGS(M1) of the transistor M1, thereby imposing an upper limit on the electric current I1 passing through the switch circuit 1.

The switch circuit 1 according to the embodiment can improve the operation reliability by imposing the upper limit on the electric current when supplying a charging current to the capacitive load CL.

Further, as charging of the capacitive load CL continues, the system SYS enters a steady state in due course. The steady state refers to a state in which charging of the capacitive load CL has been completed and the voltage of the node N2 is substantially equal to that of the node N1. In the steady state, for example, a circuit included in the function circuit 3 operates. The electric current to be consumed by the circuit included in the function circuit 3 is supplied through the switch circuit 1. For this reason, the limit of the current by the switch circuit 1 is preferably relaxed when the function circuit 3 is in the steady state.

In the switch circuit 1 according to the embodiment, the limit electric current amount varies between the state in which the capacitive load is being charged and the state in which charging of the capacitive load has been completed. To be more specific, when the capacitive load included in the function circuit is not charged and the voltage of the node N2 is lower than that of the node N1, the electric current I2 is limited to I2(lim1) expressed by "I2(lim1) (Vth (Q2)/R2)× S". On the other hand, when the capacitive load included in the function circuit is charged and the voltage of the node N2 is substantially equal to that of the node N1, the electric current I2 is limited to I2(lim2) expressed by "I2(lim2)= ((R2+RON(M3))/(R2×RON(M1)×Vth(Q2))". I2(lim2) is greater than I2(lim1). For example, when Vth(Q2) is 0.7 V, R2 is 1 kΩ, S is 1000, RON(M1) is 1Ω, and RON(M3) is 1Ω, I2(lim 1) is approximately 0.7 A and I2(lim 2) is approximately 1.4 A. By designing the electric current limit I2(lim 2) to take a value sufficiently greater than the value of the electric current assumed to pass through the switch circuit 1 in the steady state, the switch circuit 1 can execute, in the steady state, operations comparable to those of a circuit with no electric current limit.

As described above, the switch circuit 1 according to the embodiment can make the upper limit on the electric current in the steady state greater than the upper limit on the charging current. This enables a charging-current to be limited with the electric current supply capability in the steady state maintained, thereby improving the operation reliability.

In addition, the switch circuit 1 according to the embodiment includes a current path to lead the electric current I2 from the node N1 to the node N2 through the transistor M1, and a current path to lead the electric current I3 from the node N1 to the node N2 through the resistor R2 and the transistor M3.

Though an electric current might be limited by providing a resistor for a current path of the electric current to be limited, limiting a large electric current using a resistor requires such a large-sized resistor as to withstand the large electric current. The large-sized resistor is, for example, a resistor that requires a large area on a substrate or a resistance element provided outside the substrate.

In contrast, the switch circuit 1 according to the embodiment includes not only the current path for the electric current I2, which is the main electric current, but also the current path for the electric current I3, which is less than the electric current I2 in amount. A voltage difference between both terminals of the resistor R2 which is provided on the current path for the electric current I3 is employed to control the transistor Q2, and the transistor Q2 controls the gate-source voltage VGS(M1) of the transistor M1. That is, the switch circuit 1 according to the embodiment, without a resistor provided on the current path for the electric current I2, controls the gate-source voltage VGS(M1) of the transistor M1, thereby limiting the electric current amount. In the way described above, the switch circuit 1 according to the embodiment can suppress increase in the cost incurred by employing a large-sized resistor. Further, the switch circuit 1 according to the embodiment, without a resistor provided on the current path for the electric current I2, can suppress decrease in the current supply capability caused by provision of the resistor.

[4] Other Modifications

Various modifications may be made to the circuit configuration of the switch circuit 1 according to the above-described embodiment. For example, the resistance value for each resistor, the size of each transistor, the ON resistance for each transistor, and the like in the above description of the embodiment are not limited to the values described as examples. For example, in the above embodiment, the case where the size of the transistor M3 is 1/1000 the size of the transistor M1 is described as an example. The size of the transistor M3 is not limited to 1/1000 the size of the transistor M1 as long as it is smaller than the size of the transistor M1. The size of the transistor M3 can be, for example, from a few hundred to several thousand times smaller than the transistor M1.

In the above embodiment, the function circuit 3 is described by referring to the capacitive load CL, though the configuration of the function circuit 3 is not limited to this. FIG. 5 is a circuit diagram illustrating a specific example of the function circuit 3 included in the system SYS including the switch circuit 1 according to the embodiment. A specific example of the function circuit 3 shown in FIG. 5 is a charge pump. Hereinafter, the case where the function circuit 3 is the charge pump will be described. As shown in FIG. 5, the function circuit 3 includes the transistors M4 to M7, the diodes DI1 to DI3, the capacitors C1 to C3, and a charge pump control circuit 30.

The transistors M4 and M6 are, for example, the p-type MOSFET. The transistors M5 and M7 are, for example, the n-type MOSFET. An anode of the diode DI1 is coupled to the node N2. A cathode of the diode DI1 is coupled to each of one electrode of the capacitor C1 and an anode of the diode DI2. A cathode of the diode DI2 is coupled to each of one electrode of the capacitor C2 and an anode of the diode DI3. A cathode of the diode DI3 is coupled to a node N4. A source of the transistor M4 is coupled to the node N2. A drain of the transistor M4 is coupled to each of a drain of the transistor M5 and the other electrode of the capacitor C1. A gate of the transistor M4 is coupled to each of a gate of the transistor M5 and the charge pump control circuit 30. A source of the transistor M5 is grounded. A source of the transistor M6 is coupled to the node N2. A drain of the transistor M6 is coupled to each of a drain of the transistor M7 and the other electrode of the capacitor C2. A gate of the transistor M6 is coupled to each of a gate of the transistor M7 and the charge pump control circuit 30. A source of the transistor M7 is grounded. The other electrode of capacitor C3 is grounded.

The function circuit 3 may be integrated on the same semiconductor substrate as that of the switch circuit 1. Instead of being integrated on the semiconductor substrate, the capacitors C1 to C3 may be individually provided as elements external to the IC chip.

The above-described configuration enables the function circuit 3 to output a higher voltage to the node N4 than the voltage applied to the node N2. The function circuit 3 serving as the charge pump exploits the capacitors C1 to C3 to generate a voltage higher than the power supply voltage. In order to output a higher voltage stably, the capacitors C1 to C3 preferably have a high capacity. However, the capacitors C1 to C3 are capacitive loads for a circuit for supplying a power supply voltage to the charge pump. The circuit for supplying the power supply voltage to the charge pump preferably takes measures against an electric current for charging the capacitive loads.

The switch circuit 1 according to the embodiment is suitable for a circuit for supplying a power supply voltage to the function circuit 3 shown in the above specific example. As described above, the function circuit 3 to which the switch circuit 1 according to the embodiment supplies the power supply voltage can be modified variously. The above specific example is merely an example of the charge pump. The configuration of the charge pump used for the function circuit 3 is not limited to the above specific example. In addition, the function circuit 3 is not limited to the charge pump.

In addition, the system SYS including the switch circuit 1 according to the embodiment can be incorporated into, for example, a vehicle. In addition, the system SYS can be coupled to, for example, a rechargeable battery such as a lead-acid battery as the power supply PS. The system SYS, for example, may generate a high voltage to drive the gate of a transistor for controlling a motor.

In the present specification, a size relationship between transistors indicates that an aspect ratio (W/L) determined based on the gate length L and the gate width W of a transistor gate electrode is large or small. For example, M transistors coupled in parallel can be regarded as a single transistor that is M times the size of the original transistor. For example, a transistor that is one Nth the size of another transistor may be a transistor having the same gate length L and one Nth the gate width W or may be one Nth the number of transistors coupled in parallel, but is not limited to those as long as the aspect ratio (W/L) is one Nth. M and N are positive real numbers.

In the present specification, whether a voltage or a voltage difference is large or small indicates the magnitude relationship of the absolute value of the voltage or the voltage difference. For example, when the gate-source voltage of the p-type MOSFET changes from −1 V to −2 V, it is expressed as "the gate-source voltage increases".

In the present specification, the expression "charging of the capacitive load CL has been completed" refers to a state in which a voltage for charging is substantially equal to a voltage maintained in the capacity. According to circuit theory, when a constant voltage supply is coupled to a capacity via a resistor, it takes infinite time to completely finish charging the capacity. However, in actual use of a circuit, it is impractical to wait for the capacity to be fully charged. Thus, for example, when the voltage maintained in the capacity is substantially equal to that used for charging, the charging may be regarded as completed even though the charging is not completely finished according to circuit theory.

In the present specification, "one terminal of a transistor" corresponds to a drain or a source of a MOS transistor or corresponds to a collector or an emitter of a bipolar transistor. "The other terminal of the transistor" corresponds to the source or the drain of the MOS transistor or corresponds to the emitter or the collector of the bipolar transistor. "A control terminal of the transistor" corresponds to a gate of the MOS transistor or corresponds to a base of the bipolar transistor.

In the present specification, "a threshold voltage Vth of a bipolar transistor" corresponds to a voltage at which an electric current passing between the collector and the emitter exceeds a predetermined value when a voltage of the base changes, that is, a voltage at which the bipolar transistor enters the ON state. "A threshold voltage Vth of a MOS transistor" corresponds to a voltage at which an electric current passing between the drain and the source exceeds a predetermined value when a voltage of the gate changes, that is, a voltage at which the MOS transistor enters the ON state.

The term "coupling" used in the present specification refers to electrical coupling, and does not exclude intervention of, for example, another element. In addition, "electrical coupling" may be performed via an insulator, if the same operation is ensured thereby. In the present specification, "ON state" refers to a state in which the gate of a relevant transistor is applied with a voltage equal to or greater than the threshold voltage of the transistor. "OFF state" refers to a state in which the gate of a relevant transistor is applied with a voltage below the threshold voltage of the transistor, and does not exclude the state where a subtle electric current such as a leakage current in the transistor flows.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A switch circuit comprising:
    a first transistor;
    a second transistor including one terminal grounded and another terminal coupled to a control terminal of the first transistor;
    a first resistor coupled between one terminal of the first transistor and the control terminal of the first transistor;
    a third transistor including one terminal coupled to the one terminal of the first transistor and another terminal coupled to the control terminal of the first transistor;

a fourth transistor including one terminal coupled to a control terminal of the third transistor, another terminal coupled to another terminal of the first transistor, and a control terminal coupled to the control terminal of the first transistor; and a second resistor coupled between the one terminal of the third transistor and the control terminal of the third transistor.

2. The switch circuit according to claim 1, wherein the fourth transistor is smaller than the first transistor in size.

3. The switch circuit according to claim 1,
wherein when a voltage at a first logic level is applied to a control terminal of the second transistor, the one terminal of the first transistor is electrically coupled to the other terminal of the first transistor, and
wherein when a voltage at a second logic level differing from the voltage at the first logic level is applied to the control terminal of the second transistor, the one terminal of the first transistor is electrically decoupled from the other terminal of the first transistor.

4. The switch circuit according to claim 1,
wherein when a first voltage is applied to a first node corresponding to the one terminal of the first transistor and the second transistor transitions from an OFF state to a ON state with a voltage of a second node corresponding to the other terminal of the first transistor kept lower than the first voltage,
a voltage difference between a voltage of the first node and a voltage of a third node corresponding to the control terminal of the first transistor is fixed at a second voltage during a first period, and
the voltage difference between the voltage of the first node and the voltage of the third node is a third voltage that is greater than the second voltage, during a second period after the first period.

5. The switch circuit according to claim 4,
wherein during the first period, a first electric current passes from the first node to the second node, and
wherein during a third period after the second period, the voltage difference between the voltage of the first node and the voltage of the third node is fixed at a fourth voltage that is less than the third voltage, and a second electric current that is greater than the first electric current passes from the first node to the second node.

6. The switch circuit according to claim 5, wherein during the first period and the third period, the third transistor is in an ON state.

7. The switch circuit according to claim 1,
wherein when the second transistor is in the ON state and a first electric current passes from a first node corresponding to the one terminal of the first transistor to a second node corresponding to the other terminal of the first transistor, a voltage difference between a voltage of the first node and a voltage of a third node corresponding to the control terminal of the first transistor is a first voltage, and
wherein when the second transistor is in the ON state and a second electric current that is smaller than the first electric current passes from the first node to the second node, a voltage difference between a voltage of the first node and a voltage of the third node is a second voltage that is greater than the first voltage.

8. The switch circuit according to claim 7, wherein when the first electric current passes, the third transistor is in the ON state.

9. The switch circuit according to claim 1, wherein the first transistor is a MOSFET, the second transistor is a MOSFET, the third transistor is a bipolar transistor, and the fourth transistor is a MOSFET.

10. The switch circuit according to claim 1,
wherein the first transistor is a p-type MOSFET, the one terminal of the first transistor is a source, the other terminal of the first transistor is a drain, and the control terminal of the first transistor is a gate,
wherein the second transistor is an n-type MOSFET, the one terminal of the second transistor is a source, the other terminal of the second transistor is a drain, and the control terminal of the second transistor is a gate,
wherein the third transistor is a PNP bipolar transistor, the one terminal of the third transistor is an emitter, the other terminal of the third transistor is a collector, and the control terminal of the third transistor is a base, and
wherein the fourth transistor is a p-type MOSFET, the one terminal of the fourth transistor is a source, the other terminal of the fourth transistor is a drain, and the control terminal of the fourth transistor is a gate.

11. The switch circuit according to claim 1, further comprising:
a zener diode including a cathode coupled to the one terminal of the first transistor;
a third resistor coupled between an anode of the zener diode and the control terminal of the first transistor; and
a fifth transistor including one terminal coupled to the control terminal of the first transistor, another terminal coupled to the one terminal of the first transistor, and a control terminal coupled to the anode of the zener diode.

12. The switch circuit according to claim 11, wherein the fifth transistor is an NPN bipolar transistor, the one terminal of the fifth transistor is an emitter, the other terminal of the fifth transistor is a collector, and the control terminal of the fifth transistor is a base.

\* \* \* \* \*